(12) United States Patent
Tsuji

(10) Patent No.: US 11,190,190 B2
(45) Date of Patent: Nov. 30, 2021

(54) POWER SUPPLY CIRCUIT

(71) Applicant: ROHM CO., LTD., Kyoto (JP)

(72) Inventor: Masanobu Tsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/898,951

(22) Filed: Jun. 11, 2020

(65) Prior Publication Data
US 2020/0395944 A1 Dec. 17, 2020

(30) Foreign Application Priority Data
Jun. 12, 2019 (JP) .............. JP2019-109539

(51) Int. Cl.
*H03L 7/07* (2006.01)
*H03L 7/099* (2006.01)

(52) U.S. Cl.
CPC .............. *H03L 7/07* (2013.01); *H03L 7/0995* (2013.01)

(58) Field of Classification Search
CPC .......... H03L 7/07; H03L 7/0995; H02M 3/07; H02M 3/158; H02M 3/1588; H02M 3/33569; H02M 3/156; H02M 3/1582; H02M 1/08; H02M 1/14; H02M 1/36
See application file for complete search history.

(56) References Cited

U.S. PATENT DOCUMENTS

2009/0009223 A1* 1/2009 Doi ............... H03L 7/0995
  327/157
2011/0204962 A1* 8/2011 Gorisse ............ H02M 3/07
  327/536

FOREIGN PATENT DOCUMENTS

JP 2017143398 A 8/2017

OTHER PUBLICATIONS

Huy Cu Ngo, et al. "8.5 A 0.42ps-jitter ?241.7dB-FOM synthesizable injection-locked PLL with noise-isolation LDO", Solid-State Circuits Conference (ISSCC), 2017 IEEE International, pp. 5-9; Dated Feb. 9, 2017.

* cited by examiner

*Primary Examiner* — John W Poos
*Assistant Examiner* — Alex W Lam
(74) *Attorney, Agent, or Firm* — Cantor Colburn LLP

(57) ABSTRACT

An output terminal of a power supply circuit is coupled to a load. A control circuit charges multiple intermediate capacitors using an input voltage in a time-sharing manner. Furthermore, the control circuit selects at least one intermediate capacitor that is not being charged from among the multiple intermediate capacitors, and couples the intermediate capacitor thus selected to an output capacitor.

17 Claims, 14 Drawing Sheets

POWER SUPPLY CIRCUIT

CROSS REFERENCE TO RELATED APPLICATION

The present application claims priority under 35 U. S.C. § 119 to Japanese Patent Application No. 2019-109539 filed on Jun. 12, 2019, the entire content of which is incorporated herein by reference.

BACKGROUND OF THE INVENTION

1. Field of the Invention

The present invention relates to a power supply circuit.

2. Description of the Related Art

With electronic devices, power supply noise leads to a problem of abnormal device operation or a problem of degradation of the device characteristics. In order to solve such a problem, countermeasures are required. In particular, in a case in which a circuit that serves as a power supply noise source and a circuit that should avoid such power supply noise are consolidated as a single LSI (Large Scale Integrated Circuit) or IC (Integrated Circuit), it is very important to provide countermeasures against the power supply noise.

FIGS. 1A through FIG. 1C are block diagrams showing integrated circuits. An integrated circuit 1 shown in FIG. 1A has a configuration in which a first circuit 2 and a second circuit 4 are integrated. For example, the first circuit 2 is configured as a digital circuit, and operates in synchronization with a system clock. For example, the second circuit 4 is configured as a PLL (Phase Locked Loop) circuit, e.g., as a frequency synthesizer that generates a clock CLK. The clock CLK is used as a system clock, which is used in an A/D converter, D/A converter, or the like.

In the integrated circuit 1 shown in FIG. 1A, a common power supply voltage is supplied to supplied to a power supply pin of the first circuit 2 and the second circuit 4. When the first circuit 2 operates, an operation current flows in synchronization with a clock. The operation current leads to fluctuation of the power supply voltage $V_{DD}$, leading to the occurrence of power supply noise. The power supply noise also includes a noise component due to an external power supply circuit 8 itself.

The power supply noise is input to the second circuit 4 via a power supply line 6. When noise contamination occurs in the PLL circuit, this degrades the clock frequency fluctuation characteristics, phase noise characteristics, and jitter characteristics of a clock generated by the PLL circuit. Accordingly, an application that requires a high-precision clock CLK cannot employ an approach in which the power supply line and the power supply pin are shared as shown in FIG. 1A.

In the integrated circuit 1 shown in FIG. 1B, the first circuit 2 and the second circuit 4 are independently provided with a separate power supply pin. Furthermore, power supplies for the first circuit 2 and the second circuit 4 are isolated. A power supply pin VDD2 of the second circuit 4 is coupled to an external low-noise LDO (Low Drop Output) 10, i.e., a linear regulator. Such an arrangement is capable of preventing the occurrence of noise contamination in the second circuit 4 due to power supply noise that occurs in the first circuit 2. However, such an arrangement requires the integrated circuit 1 to be provided with two power supply pins, leading to an increased cost of the integrated circuit 1. Furthermore, such an external LDO 10 becomes a factor leading to an increased cost of the overall system.

The integrated circuit 1 shown in FIG. 1C is configured such that an LDO 12 is integrated on it. The LDO 12 stabilizes the voltage at the power supply pin VDD, and supplies the voltage thus stabilized to the second circuit 4. With this arrangement, the LDO 12 allows the power supply noise input to the second circuit 4 to be attenuated.

FIG. 2 is a circuit diagram showing an architecture disclosed in Non-patent document 1. This architecture can be regarded as an improved arrangement of the integrated circuit 1 shown in FIG. 1C. A PLL circuit configured as the second circuit 4 includes an oscillator block 4A configured as a DCO (Digital Controlled Oscillator) or a VCO (Voltage Controlled Oscillator) and a control block 4B thereof. From among the blocks included in the second circuit 4, the oscillator block 4A is a block that should particularly avoid power supply noise. A switch SW1 is arranged between the oscillator block 4A and the LDO 12. A gate signal GATE is generated based on a clock CLK generated by the oscillator block 4A. The switch SW1 is switched according to the clock CLK. A capacitor C0 is coupled to the LDO 12 only in the on period of the switch SW1. That is to say, during the off period, the capacitor C0 is isolated from the LDO 12. A voltage $V_{C0}$ across the capacitor C0 is supplied as the power supply voltage to the oscillator block 4A.

During the on period of the switch SW1, the capacitor C0 is charged by the output voltage $V_{LDO}$ of the LDO 12. During the off period of the switch SW1, the capacitor C0 is discharged by the operating current that flows through the oscillator block 4A. That is to say, noise contamination occurs only in the on period of the switch SW1 due to the power supply noise of the power supply that generates the voltage $V_{LDO}$. The off period of the switch SW1 provides a noise-free state. In particular, in a case in which the oscillator block 4A supports an intermittent operation in which the operating period and the suspension period are alternately repeated, the switch SW1 is turned on in the suspension period, and is turned off in the operating period. This arrangement allows the effects of the power supply noise to be reduced.

RELATED ART DOCUMENTS

Patent Documents

Patent Document 1

Japanese Patent Application Laid Open No. 2017-143398

Non-Patent Documents

Non-Patent Document 1

Huy Cu Ngo; Kengo Nakata; Toru Yoshioka; Yuki Terashima; Kenichi Okada; Akira Matsuzawa, "8.5 A 0.42ps-jitter ?241.7dB-FOM synthesizable injection-locked PLL with noise-isolation LDO", Solid-State Circuits Conference (ISSCC), 2017 IEEE International, 5-9 Feb. 2017, DOI: 10.1109/ISSCC.2017.7870305.

As a result of investing the architectures shown in FIGS. 1C and FIG. 2, the present inventor has recognized the following problem.

In a case in which the LDO 12 is integrated on the integrated circuit 1, this arrangement leads to an increased chip area of the integrated circuit 1, leading to an increased cost. Furthermore, the LDO 12 is configured as an analog circuit that involves a feedback control operation. This requires know-how for designing such an analog circuit. Accordingly, it is difficult for a circuit designer who mainly designs digital circuits (e.g., the first circuit 2 and the second circuit 4) to design such an analog circuit. In Patent document 1, an example in which the LDO is configured as a digital circuit is disclosed. However, such an arrangement involves the same problems, i.e., a problem of an increased circuit area and a problem of complicated circuit design for supporting a feedback control operation.

Furthermore, the LDO 12 involves voltage loss due to a voltage drop $\Delta V$. Accordingly, the external power supply 8 is required to generate a power supply voltage $V_{DD}$ that is higher than the power supply voltage $V_{DD(SPEC)}$ required by the second circuit 4 by a voltage difference that corresponds to the voltage drop $\Delta V$. In a case in which the first circuit 2 requires a power supply voltage that is the same as that required by the second circuit 4, the first circuit 2 receives a voltage as the power supply voltage that is higher than the required voltage $V_{DD(SPEC)}$ by $\Delta V$. This leads to a problem of increased power consumption of the first circuit 2.

SUMMARY OF THE INVENTION

The present invention has been made in order to solve such problems. Accordingly, it is an exemplary purpose of an embodiment of the present invention to provide an integrated circuit that requires no LDO to support reduced power supply noise.

An embodiment of the present invention relates to a power supply circuit. The power supply circuit comprises: an input terminal structured to receive a DC input voltage; an output terminal coupled to a load; multiple intermediate capacitors; an output capacitor coupled to the output terminal; and a control circuit structured to charge the multiple intermediate capacitors using the input voltage in a time-sharing manner, to select at least one intermediate capacitor that is not being charged from among the multiple intermediate capacitors, and to couple the intermediate capacitor thus selected to the output capacitor.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Embodiments

Figure 1A:
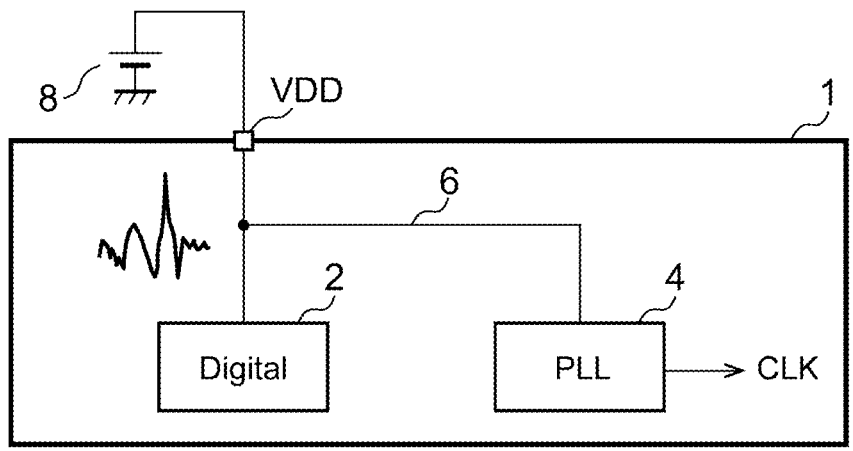
FIGS. 1A through FIG. 1C are block diagrams each showing an LSI.
Figure 1B:
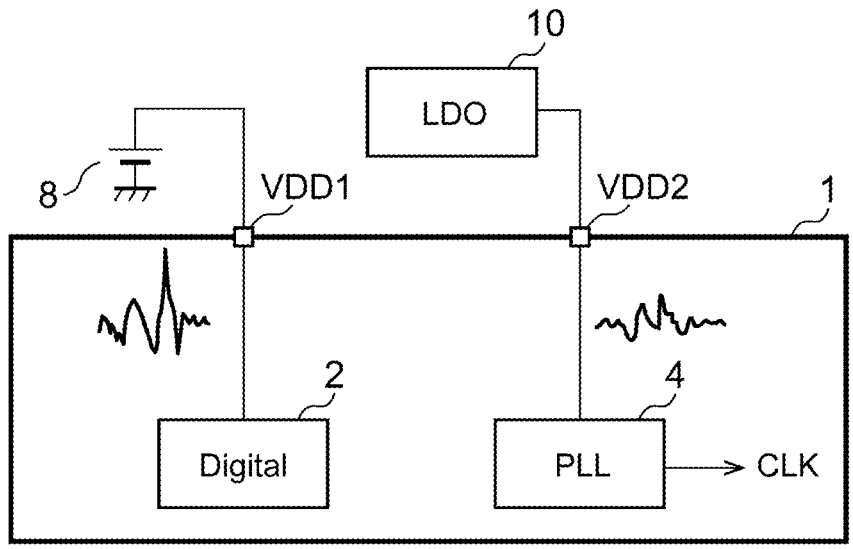
Figure 1C:
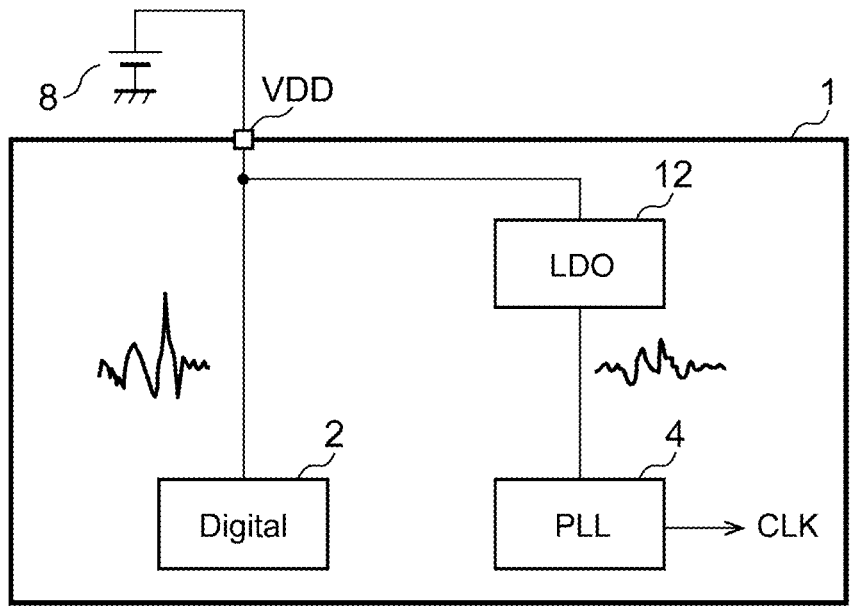
Figure 2:
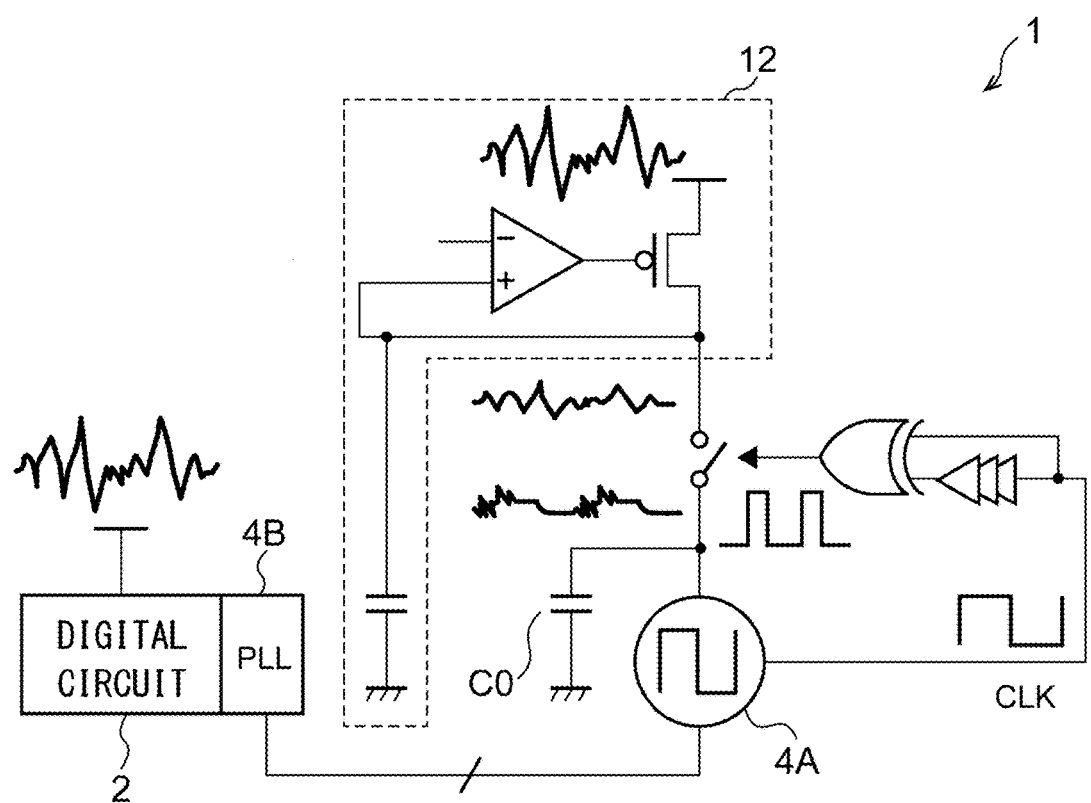
FIG. 2 is a circuit diagram showing an architecture disclosed in Non-patent document 1.

Description will be made below regarding the present invention based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, a state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Figure 3:
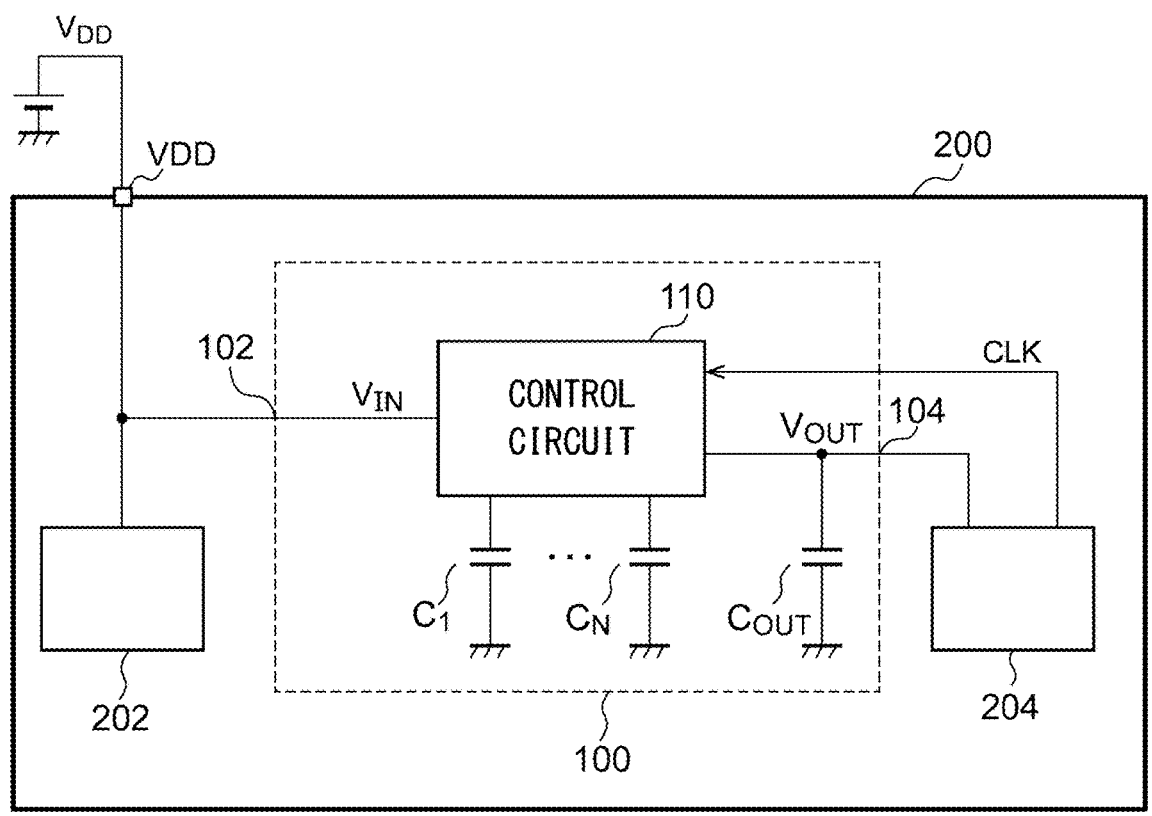
FIG. 3 is a circuit diagram showing an integrated circuit including a power supply circuit according to an embodiment.

FIG. 3 is a circuit diagram showing an integrated circuit 200 including a power supply circuit 100 according to an embodiment. The integrated circuit 200 includes circuit blocks 202 and 204 in addition to the power supply circuit 100. The first circuit block 202 includes a circuit that serves as a power supply noise source and/or a circuit having high noise resistance. The second circuit block 204 is configured as a circuit that should avoid power supply noise, i.e., a circuit having poor power supply noise resistance regardless of whether it is configured as a digital circuit or an analog circuit.

An external power supply voltage $V_{DD}$ is supplied to a power supply pin VDD of the integrated circuit 200. The power supply voltage $V_{DD}$ includes a noise component due to a power supply that generates the power supply voltage $V_{DD}$ or a power supply noise component due to the circuit block 202.

The power supply circuit 100 receives the DC power supply voltage $V_{DD}$ (input voltage $V_{IN}$) via its input terminal 102. The power supply circuit 100 removes power supply noise from the power supply voltage $V_{DD}$, and outputs a power supply voltage $V_{OUT}$ thus subjected to noise removal via an output terminal 104 thereof. The power supply voltage $V_{OUT}$ is supplied to the second circuit block 204.

The power supply circuit 100 includes multiple intermediate capacitors $C_1$ through $C_N$ (N≥2), an output capacitor $C_{OUT}$, and a control circuit 110.

The multiple intermediate capacitors $C_1$ through $C_N$ and the output capacitor $C_{OUT}$ are each arranged such that one end is grounded. Furthermore, the other end of the output capacitor $C_{OUT}$ is coupled to the output terminal 104.

The control circuit 110 is coupled to the input terminal 102, and to each of the other ends of the multiple intermediate capacitors $C_1$ through $C_N$ and the output capacitor $C_{OUT}$.

The control circuit 110 charges the multiple intermediate capacitors $C_1$ through $C_N$ using the input voltage $V_{IN}$ in a time-sharing manner. Furthermore, the control circuit 110 selects at least one intermediate capacitor that is not being charged from among the multiple intermediate capacitors $C_1$ through $C_N$, and couples the intermediate capacitor thus selected to the output capacitor $C_{OUT}$.

The above is the configuration of the power supply circuit 100. With the power supply circuit 100, the output capacitor $C_{OUT}$ is not directly coupled to the input terminal 102 in any period. Instead, at least one intermediate capacitor in a state in which it is disconnected from the input terminal 102 (non-charging state) is selected from among the multiple intermediate capacitors $C_1$ through $C_N$, and only the intermediate capacitor thus selected is coupled to the output capacitor $C_{OUT}$. As a result, power supply noise superimposed on the input voltage $V_{IN}$ is not directly supplied to the output terminal 104. This allows the power supply noise to be removed.

The power supply circuit 100 is configured with a circuit area that is smaller than that of an LDO. Such an arrangement is capable of suppressing an increase in the chip area and an increase in costs. Furthermore, unlike such an LDO, the power supply circuit 100 involves no feedback control operation. Such an arrangement has an advantage of allowing the power supply circuit 100 to be designed in a simple manner.

The present invention encompasses various kinds of apparatuses and methods that can be regarded as a block configuration or a circuit configuration shown in FIG. 3, or that can be derived from the aforementioned description. That is to say, the present invention is not restricted to a specific configuration. More specific description will be made below regarding example configurations and examples for clarification and ease of understanding of the essence of the present invention and the operation. That is to say, the following description will by no means be intended to restrict the technical scope of the present invention.

Figure 4:
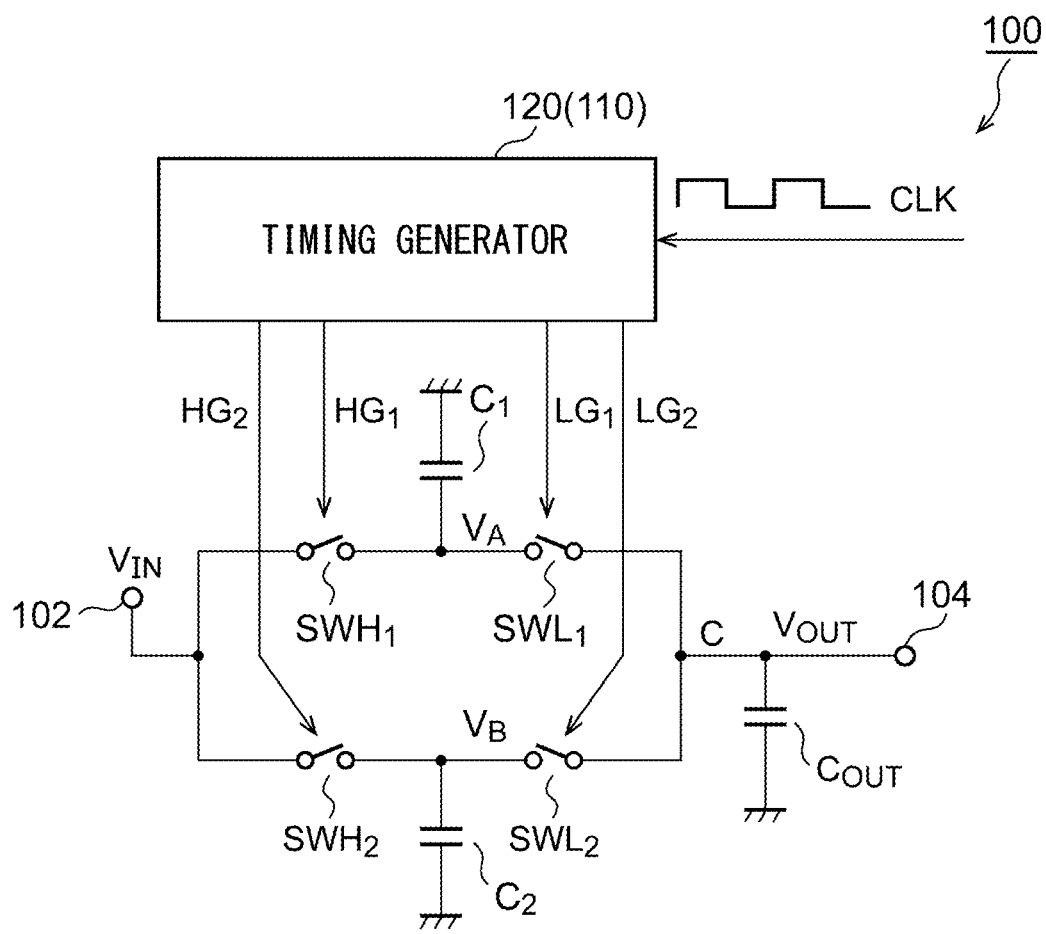
FIG. 4 is a circuit diagram showing a power supply circuit according to an embodiment.

FIG. 4 is a circuit diagram showing the power supply circuit 100 according to an example. In addition to the intermediate capacitors $C_1$ through $C_N$ and the output capacitor $C_{OUT}$, the power supply circuit 100 includes multiple high-side switches SWH, multiple low-side switches SWL, and a timing generator 120, which correspond to the control circuit 110. The number N of the intermediate capacitors is not restricted in particular. Description will be made regarding an example in which N=2. In this example, "$C_1$" represents a first intermediate capacitor, and "$C_2$" represents a second intermediate capacitor.

The multiple high-side switches $SWH_\#$ (#=1 through N) are each arranged between the input terminal 102 and the corresponding intermediate capacitor $C_\#$. The multiple low-side switches $SWL_\#$ (#=1 through N) are each arranged between the output terminal 104 and the corresponding intermediate capacitor $C_\#$.

The timing generator 120 generates upper-side gate signals $HG_1$ through $HG_N$, and lower-side gate signals $LG_1$ through $LG_N$, so as to control the multiple high-side switches $SWH_1$ through $SWH_N$, and the multiple low-side switches $SWL_1$ through $SWL_N$.

For example, the switches SWH and SWL may each be configured as a P-channel MOSFET (Metal Oxide Semiconductor Field Effect Transistor). In this case, when the gate signals HG and LG are set to the high level, the switches SWH and SWL are turned off. Conversely, when the gate signals HG and LG are set to the low level, the switches SWH and SWL are turned on.

Various kinds of examples can be made with respect to the configuration of the timing generator 120 and the timing control operation. Description will be made below regarding several such examples.

FIRST EXAMPLE

The control circuit 110 is switchable between a first charging state $\phi_1$, a second charging state $\phi_2$, and a non-charging state $\phi_{NC}$. First, description will be made regarding the operation of the high-side circuit configuration.

First charging state $\phi_1$

In the first charging state $\phi_1$, the first intermediate capacitor $C_1$ is charged by the input voltage $V_{IN}$.

$SWH_1$=ON $SWH_2$=OFF

Second charging state $\phi_2$

In the second charging state $\phi_2$, the second intermediate capacitor $C_2$ is charged by the input voltage $V_{IN}$.

$SWH_1$=OFF $SWH_2$=ON

Non-charging state $\phi_{NC}$

In the non-charging state $\phi_{NC}$, both the first intermediate capacitor $C_1$ and the second intermediate capacitor $C_2$ are not charged.

$SWH_1$=OFF $SWH_2$=OFF

The control circuit 110 sequentially repeats the first charging state $\phi_1$, the non-charging state $\phi_{NC}$, the second charging state $\phi_2$, and the non-charging state $\phi_{NC}$.

Next, description will be made regarding the operation of the low-side circuit configuration.

First charging state $\phi_1$

The second intermediate capacitor $C_2$ is coupled to the output capacitor $C_{OUT}$.

$SWL_1$=OFF $SWL_2$=ON

Second charging state $\phi_2$

The first intermediate capacitor $C_1$ is coupled to the output capacitor $C_{OUT}$.

$SWL_1$=ON $SWL_2$=OFF

Non-charging state $\phi_{NC}$

Both the first intermediate capacitor $C_1$ and the second intermediate capacitor $C_2$ are disconnected from the output capacitor $C_{OUT}$.

$SWL_1$=OFF
$SWL_2$=OFF

Figure 5:
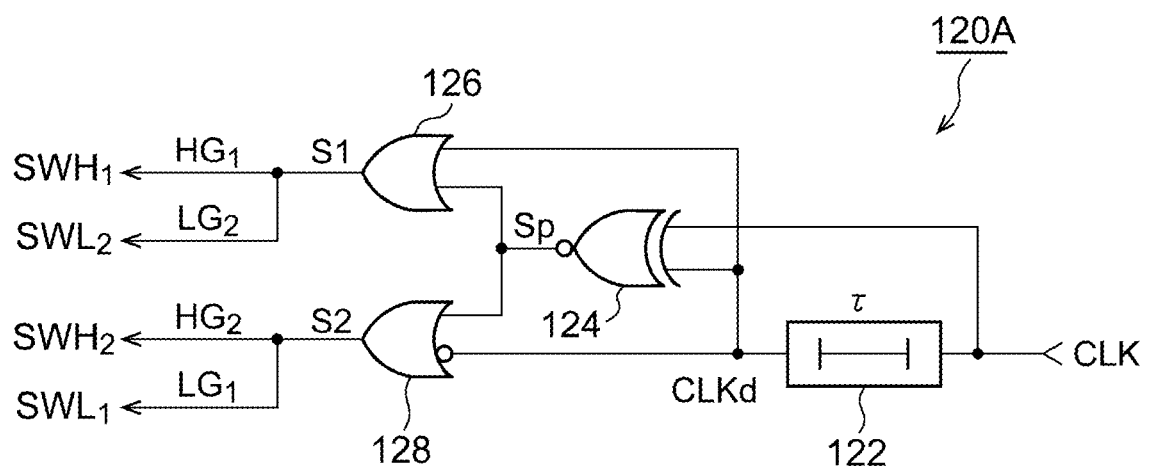
FIG. 5 is a circuit diagram showing a timing generator according to a first example.

FIG. 5 is a circuit diagram showing a timing generator 120A according to the first example. During the first charging period with one edge (positive edge) from among the positive edge and the negative edge of the clock CLK as a start point, the timing generator 120A turns on the first high-side switch $SWH_1$ and the second low-side switch $SWL_2$. During the second charging period with the other edge (negative edge) from among the positive edge and the negative edge of the clock CLK as a start point, the timing generator 120A turns on the second high-side switch $SWH_2$ and the first low-side switch $SWL_1$.

The timing generator 120A includes a delay line 122, an EX-NOR gate 124, and OR gates 126 and 128. The delay line 122 applies a delay to the clock CLK. Specifically, the delay line 122 applies a delay amount τ that is shorter than a half-cycle of the clock CLK. The delay line 122 may be configured as an inverter chain. Also, other kinds of delay circuits may be employed.

The EX-NOR gate 124 generates the EX-NOR (Exclusive-NOR) of the clock CLK before the delay and the clock CLKd after the delay. An output Sp of the EX-NOR gate 124 is configured as a pulse signal, which is set to the low level for a period of the delay time τ with the positive edge or the negative edge of the clock CLK as a start point.

The OR gate 126 is arranged such that the delayed clock CLKd is input to one input thereof and the output Sp of the EX-NOR gate is input to the other input thereof. During a period of the delay time τ from the positive edge of the original clock CLK, the output S1 of the OR gate 126 is set to the low level. The gate signals $HG_1$ and $LG_2$ are generated based on the output S1 of the OR gate 126, so as to control the switches $SWH_1$ and $SWL_2$.

The OR gate 128 is arranged such that the inverted signal of the delayed clock CLKd is input to one input thereof and the output Sp of the EX-NOR gate is input to the other input thereof. During a period of the delay time τ from the negative edge of the original clock CLK, the output S2 of the OR gate 128 is set to the low level. The gate signals $HG_2$ and $LG_1$ are generated based on the output S2 of the OR gate 128, so as to control the switches $SWH_2$ and $SWL_1$. It can be clearly understood by those skilled in this art that various kinds of modifications may be made for the timing generator 120A that are capable of supporting the same function, which are encompassed in the technical scope of the present invention.

Figure 6:
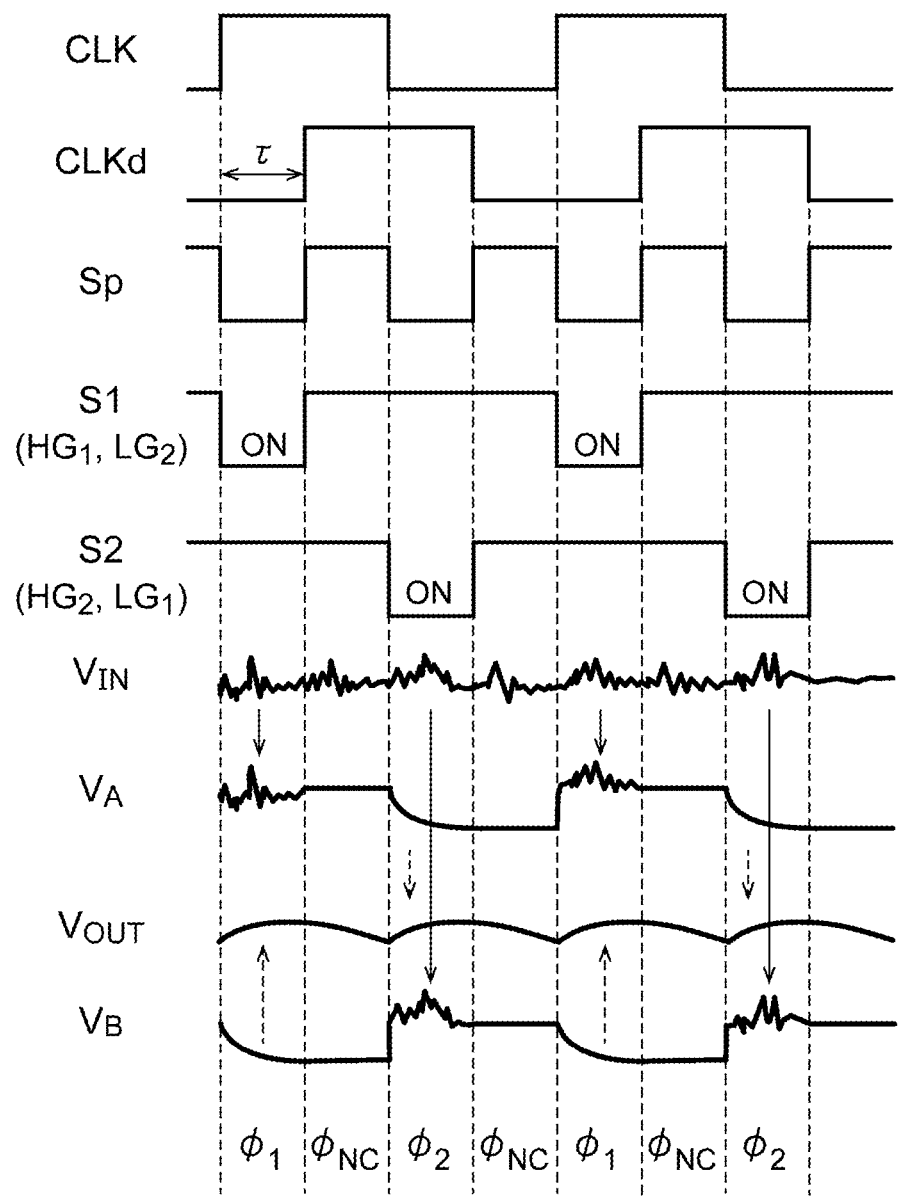
FIG. 6 is an operation waveform diagram showing the operation of a power supply circuit according to the first example.

FIG. 6 is an operation waveform diagram showing the operation of the power supply circuit 100 according to the first example. Here, "$V_A$" and "$V_B$" represent the voltage waveforms of the first intermediate capacitor $C_1$ and the second intermediate capacitor $C_2$, respectively. "$V_{OUT}$" indicates the output voltage across the output capacitor $C_{OUT}$.

In the first charging state $\phi_1$, the first intermediate capacitor $C_1$ is charged by the input voltage $V_{IN}$, thereby raising the voltage $V_A$. In this stage, a power supply noise component is superimposed on the voltage $V_A$. During this period, the second capacitor $C_2$ is coupled to the output capacitor $C_{OUT}$. In this state, the charge stored in the first intermediate capacitor $C_2$ flows to the output capacitor $C_{OUT}$. This charges the output capacitor OUT, thereby raising the output voltage $V_{OUT}$.

Subsequently, in the non-charging state $\phi_{NC}$, the output capacitor $C_{OUT}$ is discharged by a load current, thereby lowering the output voltage $V_{OUT}$. In this state, no charge flow occurs in either the first intermediate capacitor $C_1$ or the second intermediate capacitor $C_2$. Accordingly, the voltages $V_A$ and $V_B$ are each maintained at a constant level.

Subsequently, in the second charging state $\phi_2$, the second intermediate capacitor $C_2$ is charged by the input voltage $V_{IN}$, thereby raising the voltage $V_B$. During this period, the first intermediate capacitor $C_1$ is coupled to the output capacitor $C_{OUT}$. In this state, the charge stored in the first intermediate capacitor $C_1$ flows to the output capacitor $C_{OUT}$. This charges the output capacitor $C_{OUT}$, thereby raising the output voltage $V_{OUT}$.

Subsequently, in the non-charging state $\phi_{NC}$, the output capacitor $C_{OUT}$ is discharged by the load current, thereby lowering the output voltage $V_{OUT}$T Charge flow occurs in neither the first intermediate capacitor $C_1$ mor the second intermediate capacitor $C_2$. Accordingly, the voltages $V_A$ and $V_B$ are each maintained at a constant level.

The power supply circuit 100 according to the first example repeats this operation. With the first example, the output voltage $V_{OUT}$ thus generated includes no power supply noise that is included in the input voltage $V_{IN}$.

It should be noted that the non-charging state $\phi_{NC}$ may be designed to be shorter than the first charging state $\phi_1$ and the second charging state $\phi_2$. Ideally, the non-charging state $\phi_{NC}$ may be omitted. However, in actuality, in a case in which the non-charging state $\phi_{NC}$ is designed to be excessively short, such an arrangement has the potential to cause timing mismatching, leading to a situation in which the input voltage $V_{IN}$ including the power supply noise is directly input to the output terminal 104. In other words, in a case of inserting such a non-charging state $\phi_{NC}$, this arrangement provides relief from the need for severe timing design.

SECOND EXAMPLE

First, description will be made regarding the operation of the high-side switches. The control circuit 110 is configured to be switchable between the first charging state $\phi_1$ and the second charging state $\phi_2$.

First charging state $\phi_1$

In the first charging state $\phi_1$, the first intermediate capacitor $C_1$ is charged by the input voltage $V_{IN}$.

$SWH_1$=ON
$SWH_2$=OFF

Second charging state $\phi_2$

In the second charging state $\phi_2$, the second intermediate capacitor $C_2$ is charged by the input voltage $V_{IN}$.

$SWH_1$=OFF
$SWH_2$=ON

The control circuit 110 sequentially and alternately repeats the first charging state $\phi_1$ and the second charging state $\phi_2$.

Next, description will be made regarding the operation of the low-side switches.

During a part of the time period of the first charging state $\phi_1$, the control circuit 110 turns on the second low-side switch $SWL_2$ so as to couple the second intermediate capacitor $C_2$ to the output capacitor $C_{OUT}$.

Furthermore, during a part of the time period of the second charging state $\phi_2$, the first low-side switch $SWL_1$ is turned on so as to couple the first intermediate capacitor $C_1$ to the output capacitor $C_{OUT}$.

Figure 7:
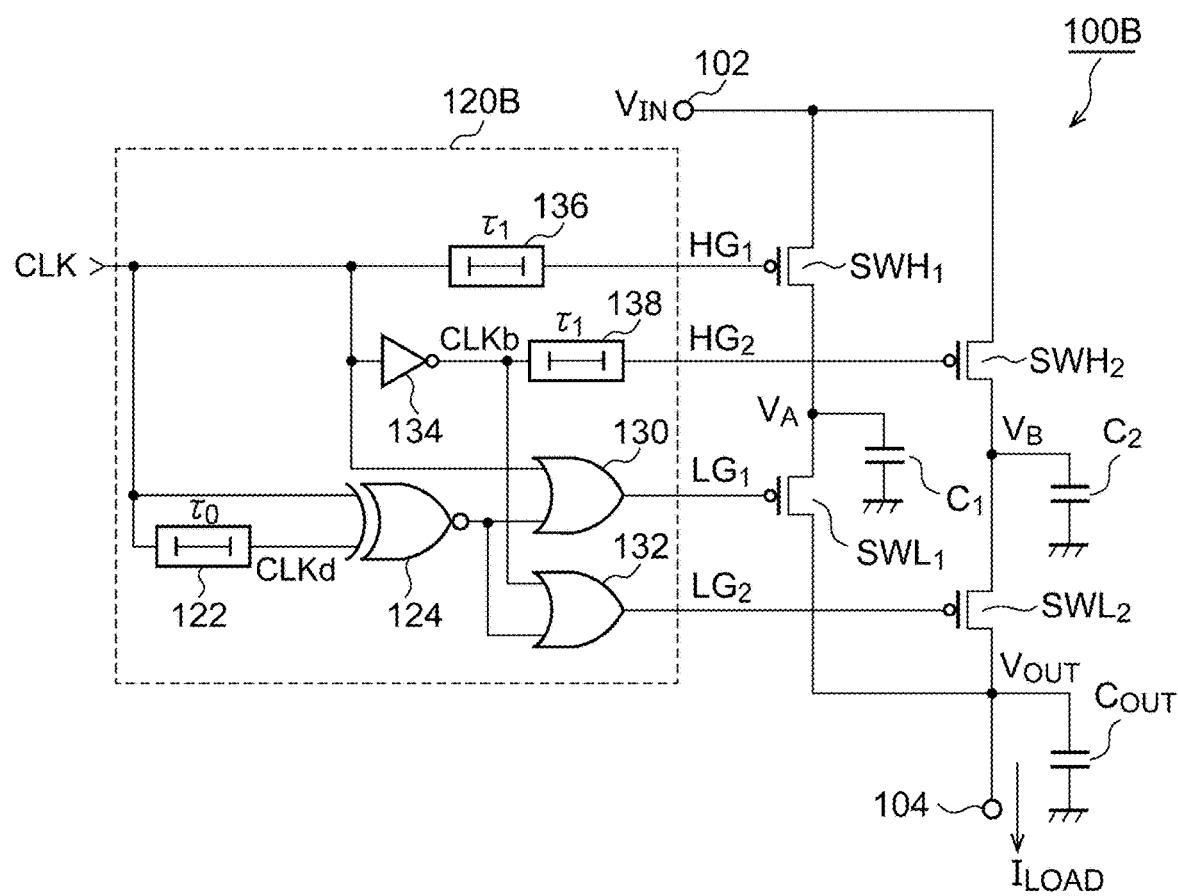
FIG. 7 is a circuit diagram showing a power supply circuit according to a second example.

FIG. 7 is a circuit diagram showing a power supply circuit 100B according to a second example. During the first period $T_1$, a timing generator 120B turns on the first low-side switch $SWL_1$ with one edge (negative edge) from among the positive and negative edges of the clock CLK as a start point. Furthermore, during the second period $T_2$, the timing generator 120B turns on the second low-side switch $SWL_2$ with the other edge (positive edge) from among the positive and negative edges of the clock CLK as a start point.

Furthermore, during a half-cycle of the clock CLK delayed such that it includes the first period $T_1$, the timing generator 120B turns on the second high-side switch $SWH_2$. Moreover, during a half-cycle of the clock CLK delayed such that it includes the second period $T_2$, the timing generator 120B turns on the first high-side switch $SWH_1$.

The delay line 122 and the EX-NOR gate 124 are each configured to generate the pulse signal Sp in the same manner as in FIG. 5.

A delay line 136 delays the clock CLK so as to generate the $HG_1$ signal. An inverter 134 inverts the clock CLK. A delay line 138 delays the inverted clock CLKb so as to generate the $HG_2$ signal.

An OR gate 130 generates the $LG_1$ signal based on the logical OR of CLK and Sp. An OR gate 132 generates the $LG_2$ signal based on the logical OR of CLKb and Sp. It can be clearly understood by those skilled in this art that various modifications may be made for the timing generator 120B that support the same functions, which are encompassed in the technical scope of the present invention.

Figure 8:
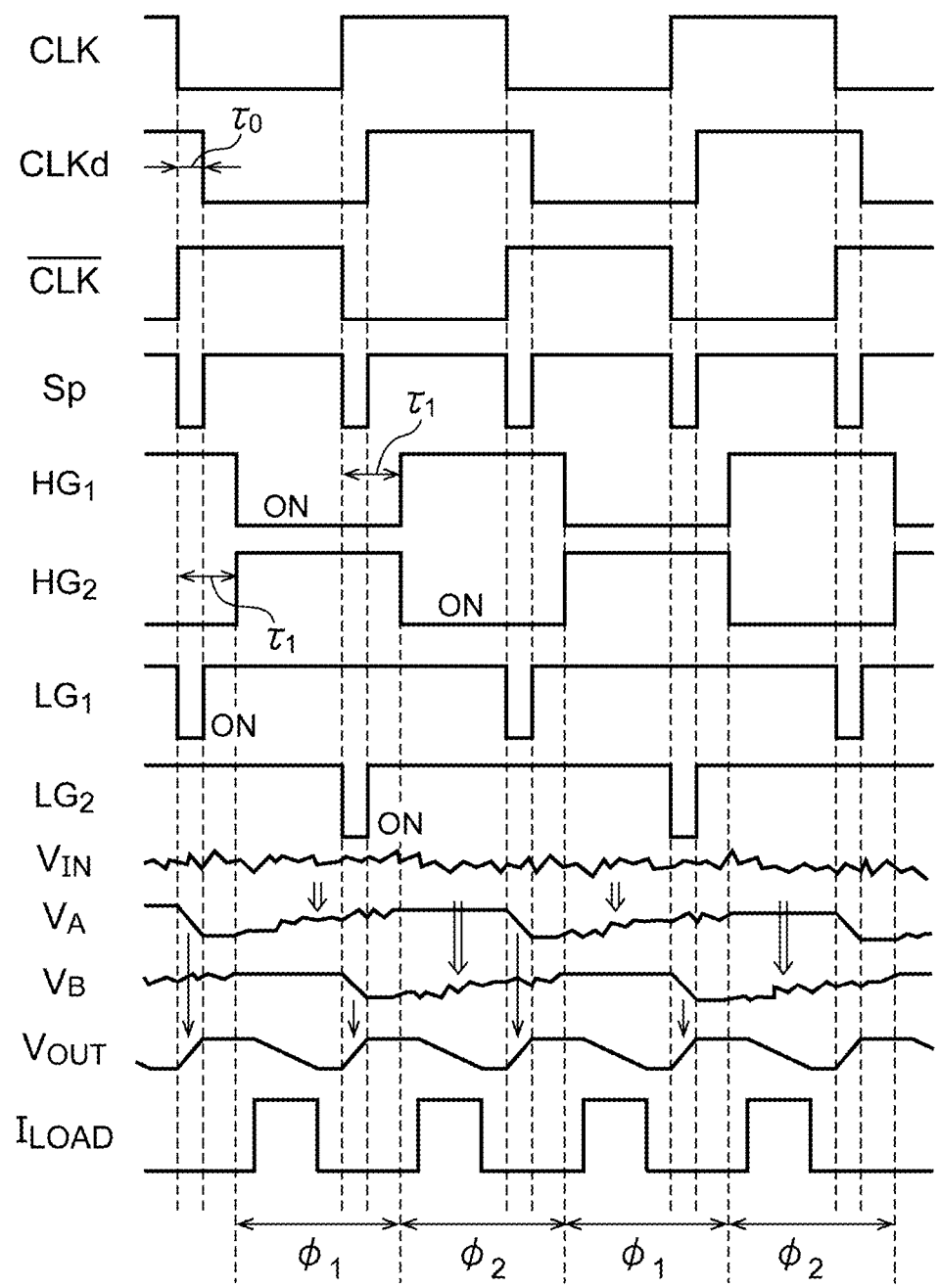
FIG. 8 is an operation waveform diagram showing the operation of the power supply circuit according to the second example.

FIG. 8 is an operation waveform diagram showing the operation of the power supply circuit 100B according to the second example. A digital circuit that operates in synchronization with the clock CLK is activated with an edge of the clock as a trigger, which generates an internal state transition. Accordingly, from a microscopic viewpoint, in some cases, the load current $I_{LOAD}$ flows in an intermittent manner. That is to say, during a part of the clock cycle (active section), the load current $I_{LOAD}$ flows. On the other hand, during the other part of the clock cycle (inactive section), the load current $I_{LOAD}$ does not flow. In this case, the output voltage $V_{OUT}$ decreases in the active section. On the other hand, in the inactive section, the output voltage $V_{OUT}$ is maintained at a constant level.

In comparison between the first example and the second example, the timing generator 120A shown in FIG. 5 does not require the delay lines 136 and 138 shown in FIG. 7B. This allows the timing generator 120A shown in FIG. 5 to be configured with a reduced circuit area.

With the first and second examples, in a case in which the delay amount τ to be provided by the delay line 136 is fixedly designed, this arrangement provides the following effects. When fluctuation occurs in the temperature or the power supply voltage, this changes the delay amount τ, which increases the pulse width of the pulse signal Sp. This changes the charging time in which the intermediate capacitor is charged or the charging time in which the output capacitor is charged. This provides a feedback control operation so as to suppress the fluctuation in the output voltage $V_{OUT}$. For example, when the power supply voltage $V_{DD}$ ($V_{IN}$) falls, this increases the delay amount provided by the delay line 136. This increases the charging time, thereby offsetting the reduction in the input voltage $V_{IN}$. Furthermore, when the circuit current rises due to an increase in the clock frequency, an equivalent resistance value $R_{EQ}$ formed by the switch and the intermediate capacitor is reduced. Accordingly, this arrangement provides a feedback control operation so as to offset a reduction in the input voltage $V_{IN}$ in the same manner.

Figure 9A:
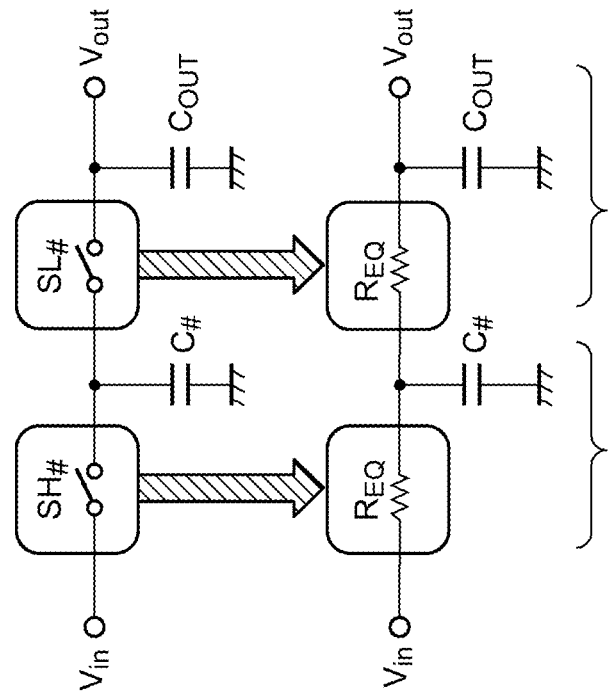
FIGS. 9A and FIG. 9B are equivalent circuit diagrams each showing the power supply circuit.
Figure 9B:
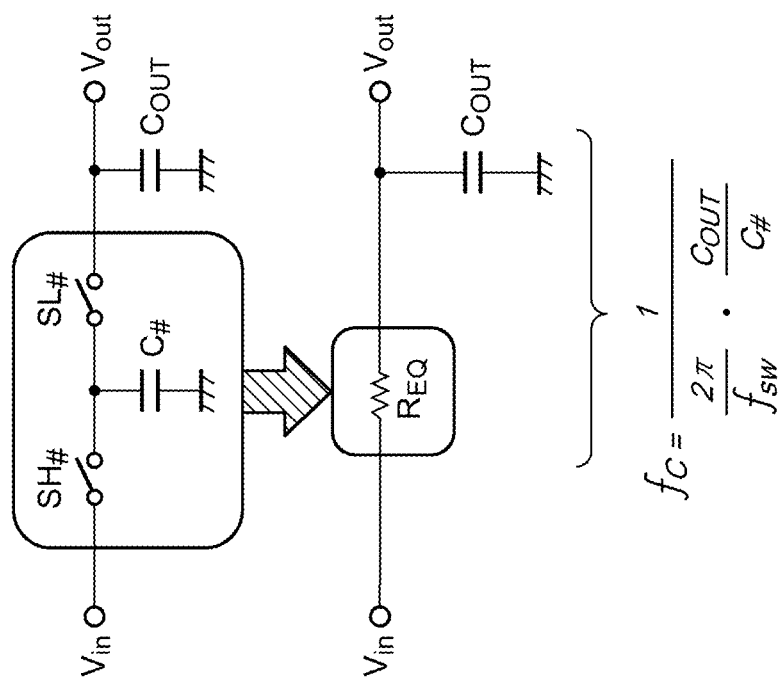

FIGS. 9A and 9B are equivalent circuit diagrams each showing the power supply circuit 100. Description will be made with reference to FIG. 9A with the on resistance of each of the high-side switch $SWH_\#$ and the low-side switch $SWL_\#$ as $R_{ON}$, with the switching frequency as $f_{SW}$, and with the on time as $T_{ON}$ (delay time τ described above). With this arrangement, in a case in which the on time $T_{ON}$ is sufficiently long so as to allow the capacitors $C_\#$ and $C_{OUT}$ to be charged, i.e., in a case in which $T_{ON} > (R_{ON} \times C[\#, OUT])$, a circuit formed of the high-side switch $SWH_\#$ and the capacitor $C_\#$ can be represented by the following equivalent resistance $R_{EQ}$ based on the charge conservation law.

$$R_{EQ} = 1/(f_{SW} \times C_\#).$$

Accordingly, the output capacitor $C_{OUT}$ and the equivalent resistance $R_{EQ}$ formed of the high-side switch $SWH_\#$ and the capacitor $C_\#$ form a first-order low-pass filter having a cutoff frequency represented by the following Expression.

$$fc = 1/(2\pi \cdot R_{EQ} \cdot C_{OUT}) = 1/(2\pi/f_{SW} \cdot C_{OUT}/C_\#)$$

The cutoff frequency fc can be controlled using the switching frequency $f_{SW}$.

Description will be made with reference to FIG. 9B. FIG. 9B is an equivalent circuit diagram in a case in which the on time $T_{ON}$ is not sufficiently long to charge the capacitors $C_\#$ and $C_{OUT}$, i.e., in a case in which $T_{ON} < (R_{ON} \times C[\#, OUT])$. In this case, the high-side switches $SWH_\#$ and the low-side switches $SWL_\#$ are each represented by the following equivalent resistance $R_{EQ}$.

$$R_{EQ} = R_{ON}/(T_{ON} \times f_{SW})$$

Here, ($T_{ON} \times f_{SW}$) represents the ratio of the on time with respect to the cycle (i.e., duty ratio).

Accordingly, the equivalent resistance $R_{EQ}$ of the high-side switch $SWH_\#$ and the capacitor $C_\#$ forms a first-order low-pass filter having a cutoff frequency $f_{CH}$ represented by $f_{CH} = 1/(2\pi \cdot R_{EQ} \cdot C_\#)$.

In this case, the cutoff frequency $f_{CH}$ does not depend on the switching frequency. Instead, the cutoff frequency $f_{CH}$ can be controlled using the duty ratio.

Furthermore, the output capacitor $C_{OUT}$ and an equivalent resistance $R_{EQ}$ of the low-side switch $SWL_\#$ also form a first-order low-pass filter having a cutoff frequency $f_{CL}$ represented by $f_{CL} = 1/(2\pi \cdot R_{EQ} \cdot C_{OUT})$.

In this case, the cutoff frequency $f_{CL}$ does not depend on the switching frequency. Instead, the cutoff frequency can be controlled using the duty ratio.

As an overall circuit configuration of the power supply circuit 100, a series connection of the two first-order low-pass filter stages (i.e., a second-order filter) is formed.

In the first or second example, in a case in which the delay amount τ is changed in conjunction with the cycle of the clock CLK, such an arrangement provides the following effects.

The delay amount τ of the delay line 136 corresponds to the on time $T_{ON}$. Accordingly, by controlling the cycle of the clock CLK and the on period $T_{ON}$ in conjunction, such an arrangement is capable of maintaining the duty ratio at a constant level, thereby maintaining the cutoff frequency provided by the power supply circuit 100 that also functions as a low-pass filter.

In addition, the control operation described in the first example has the following advantage as compared with the second example. That is to say, with the second example, the high-side switches are switched at a duty ratio of 50%. Accordingly, the low-pass filter provides a relatively high cutoff frequency $f_{CH}$. In contrast, with the first example, the high-side switches are switched at a lower duty ratio. This allows the cutoff frequency $f_{CH}$ of the low-pass filter to be reduced. This allows a lower-frequency power supply noise component to be removed.

Figure 10:
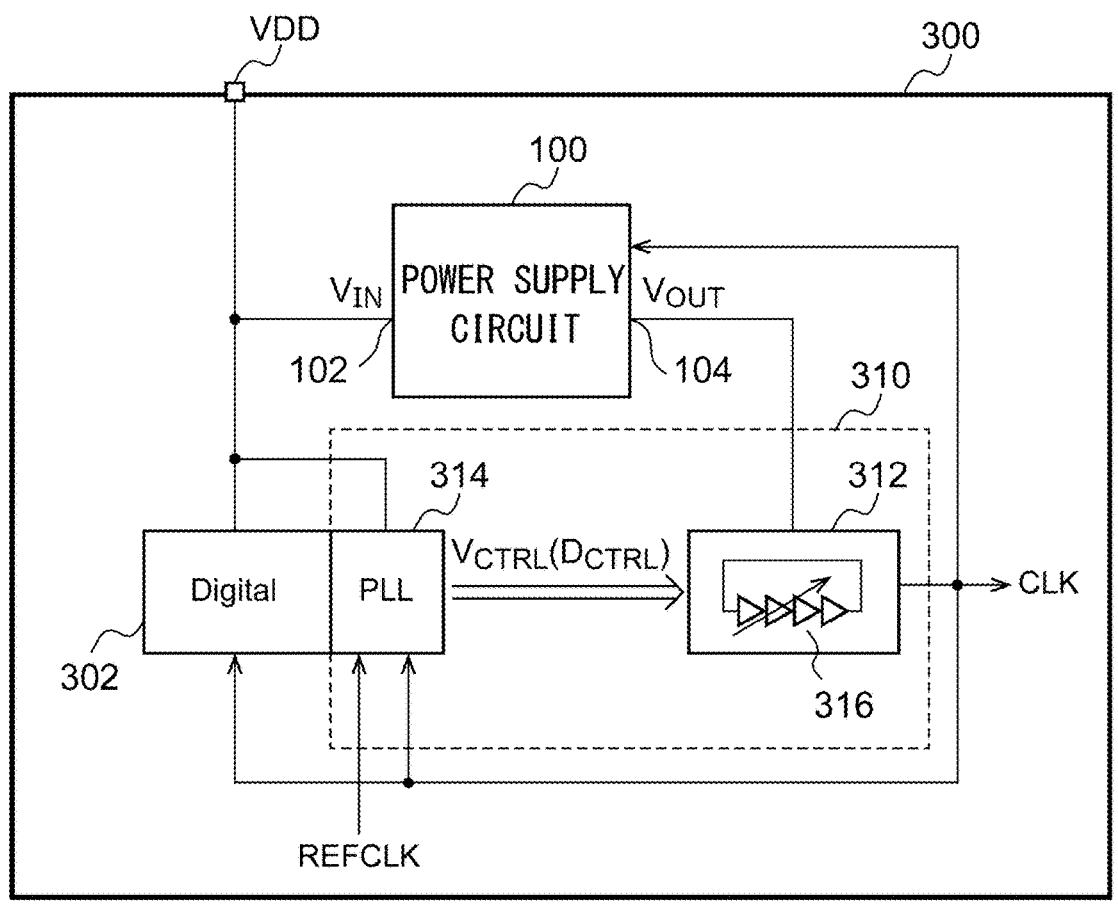
FIG. 10 is a circuit diagram showing an integrated circuit according to an example.

FIG. 10 is a circuit diagram showing an integrated circuit 300 according to an example. The integrated circuit 300 includes a digital circuit 302 having high noise resistance, a PLL circuit 310, and a power supply circuit 100.

The PLL circuit 310 includes a variable-frequency oscillator 312 and a feedback circuit 314. The PLL circuit 310 generates a system clock CLK having a frequency obtained by multiplying the frequency of a reference clock REFCLK, and supplies the system clock CLK to the digital circuit 302.

The variable-frequency oscillator 312 is configured as a VCO (Voltage Controlled Oscillator) or a DCO (Digital Controlled Oscillator). The variable-frequency oscillator 312 includes a delay circuit 316 configured such that its output is fed back to its input. The clock CLK generated by the variable-frequency oscillator 312 is fed back to the feedback circuit 314. The feedback circuit 314 generates a control voltage $V_{CTRL}$ (or control code $D_{CTRL}$) based on the reference clock REFCLK, and adjusts the delay amount of the delay circuit 316.

The digital circuit 302 and the feedback circuit 314 are each configured as a circuit having high noise resistance. The power supply voltage $V_{DD}$ is directly supplied via the power supply pin VDD to the digital circuit 302 and the feedback circuit 314.

In contrast, in the variable-frequency oscillator 312, power supply noise appears as phase noise of the clock CLK. That is to say, the variable-frequency oscillator 312 has poor power supply noise resistance. Accordingly, the output voltage $V_{OUT}$ of the power supply circuit 100 is supplied to the power supply terminal of the variable-frequency oscillator 312.

The power supply circuit 100 is configured to switch its state based on the clock CLK generated by the variable-frequency oscillator 312. It should be noted that, in a case in which the timing generator 120 of the power supply circuit 100 has the configuration shown in FIG. 5 or FIG. 7, the delay line 122 may preferably be configured as a replica of the delay circuit 316. Furthermore, the delay amount of the delay line 122 may preferably be controlled such that it follows the delay amount of the delay circuit 316. As described with reference to FIG. 9, this arrangement is capable of maintaining the cutoff frequency provided by the power supply circuit 100 that also functions as a low-pass filter at a constant level.

Figure 11A:
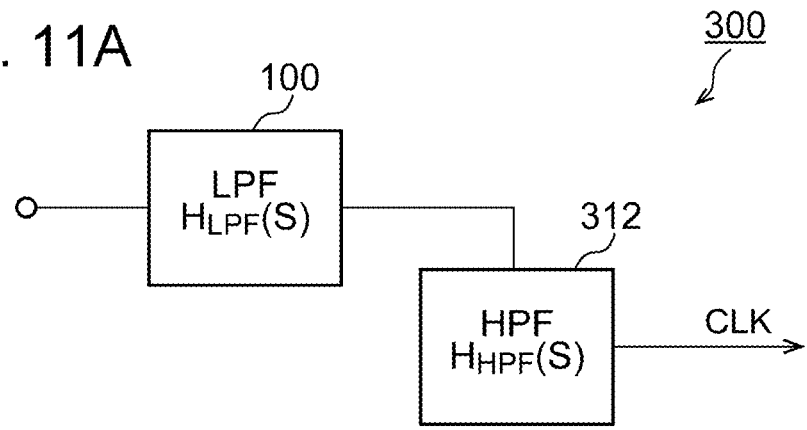
FIG. 11A is an equivalent circuit diagram showing the integrated circuit.

FIG. 11A is an equivalent circuit diagram showing an integrated circuit 300. With a typical second-order PLL, the noise characteristics of a variable-frequency oscillator 312 (frequency characteristics of phase noise with respect to the frequency of the power supply noise) is represented by a transfer function of the second-order high-pass filter characteristics $H_{HPF}(s)$. On the other hand, as described above, the power supply circuit 100 can be represented by a transfer function of the low-pass filter characteristics $H_{LPF}(s)$.

Figure 11B:
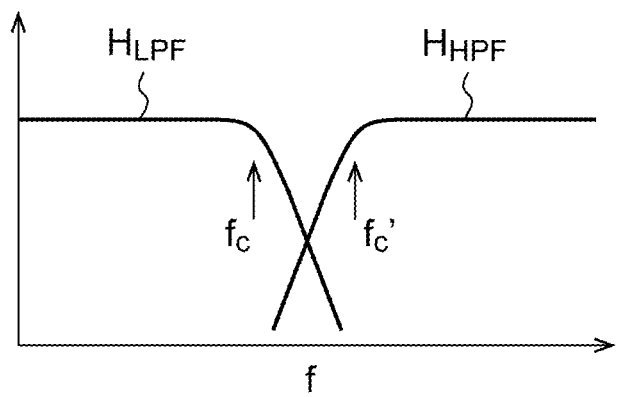
FIG. 11B is a diagram showing the frequency characteristics of the integrated circuit as a whole.

Accordingly, as shown in FIG. 11B, by determining an operating condition such that the cutoff frequency of the low-pass filter is lower than the cutoff frequency fc' of the high-pass filter, such an arrangement is capable of appropriately removing the phase noise of the clock CLK.

Figure 12:
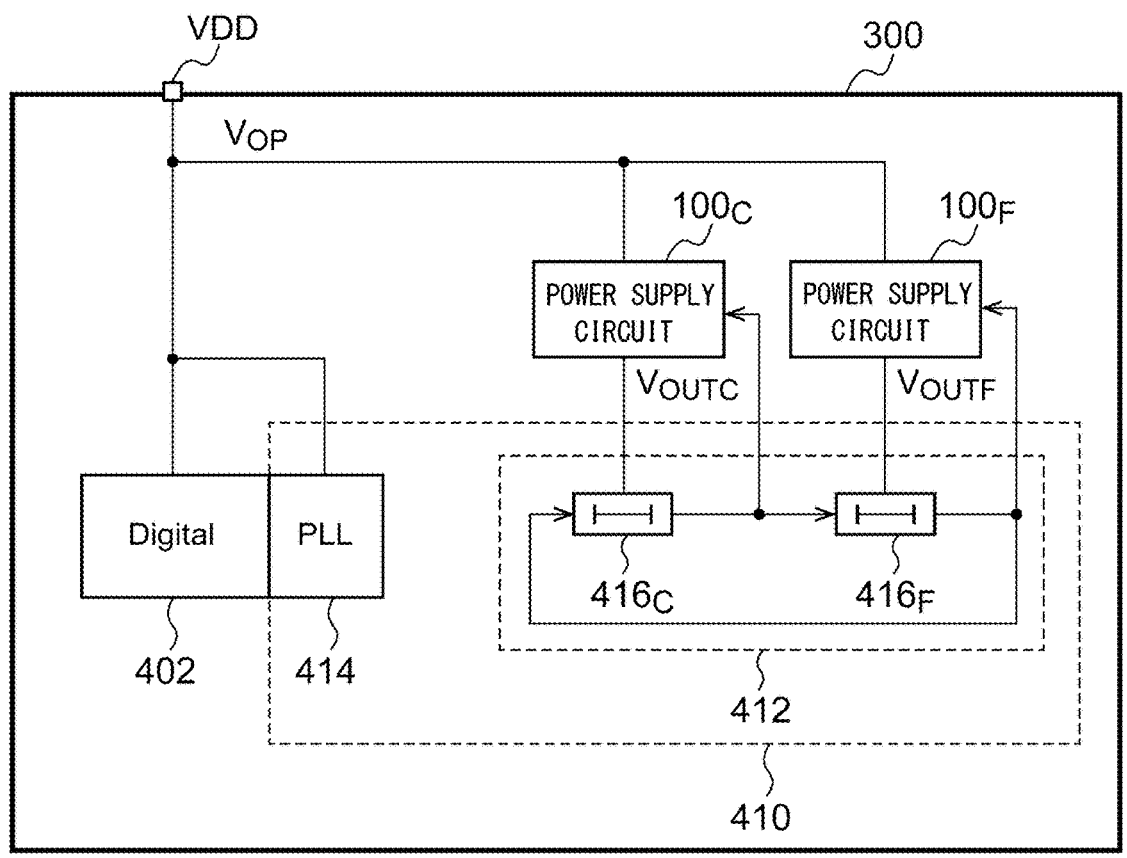
FIG. 12 is a circuit diagram showing an integrated circuit according to an example.

FIG. 12 is a circuit diagram showing an integrated circuit 400 according to an example. The integrated circuit 400 includes a digital circuit 402, a PLL circuit 410, and power supply circuits $100_C$ and $100_F$. A variable-frequency oscillator 412 of the PLL circuit 410 includes two delay circuits $416_C$ and $416_F$ coupled in series. The delay circuit $416_C$ provides a delay that is controllable with a relatively low resolution. The delay circuit $416_F$ provides a delay that is controllable with a relatively high resolution. That is to say, the variable-frequency oscillator 412 adjusts the oscillation frequency with low resolution by means of the delay circuit $416_C$. Furthermore, the variable-frequency oscillator 412 adjusts the oscillation frequency with high resolution by means of the delay circuit $416_F$. The delay circuits $416_C$ and $416_F$ have different configurations according to the delay range. For example, the first-stage delay circuit $416_C$ may be configured including multiple logic gates that each provide a unit delay such that they are coupled so as to form a multi-stage delay circuit. Furthermore, the number of the logic gates through which a given signal passes may be changed according to a control code. On the other hand, the second-stage delay circuit $416_F$ may be configured such that a variable capacitor is coupled to a clock propagation line. Furthermore, the capacitance of the variable capacitor may be adjusted.

The power supply circuit $100_C$ supplies an output voltage $V_{OUTC}$ to the delay circuit $416_C$. The clock to be used to control the state transition of the power supply circuit $100_C$ may be taken from the output of the corresponding delay circuit $416_C$. Similarly, the power supply circuit $100_F$ supplies an output voltage $V_{OUTF}$ to the delay circuit $416_F$. The clock to be used to control the state transition of the power supply circuit $100_F$ may be taken from the output of the corresponding delay circuit $416_F$.

In a case in which the timing generator 120 of the power supply circuit $100_C$ has the configuration shown in FIG. 5 or FIG. 7, the delay line 122 may preferably be configured as a replica of the delay circuit $416_C$. Furthermore, a corresponding control code may preferably be supplied to the delay line 122 and the delay circuit $416_C$ such that the delay amount of the delay line 122 follows the delay amount of the delay circuit $416_C$.

Similarly, in a case in which the timing generator 120 of the power supply circuit $100_F$ has the configuration shown in FIG. 5 or FIG. 7, the delay line 122 may preferably be configured as a replica of the delay circuit $416_F$. Furthermore, the delay amount of the delay line 122 may preferably be controlled such that it follows the delay amount of the delay circuit $416_F$.

The above is the configuration of the integrated circuit 400.

Figure 13:
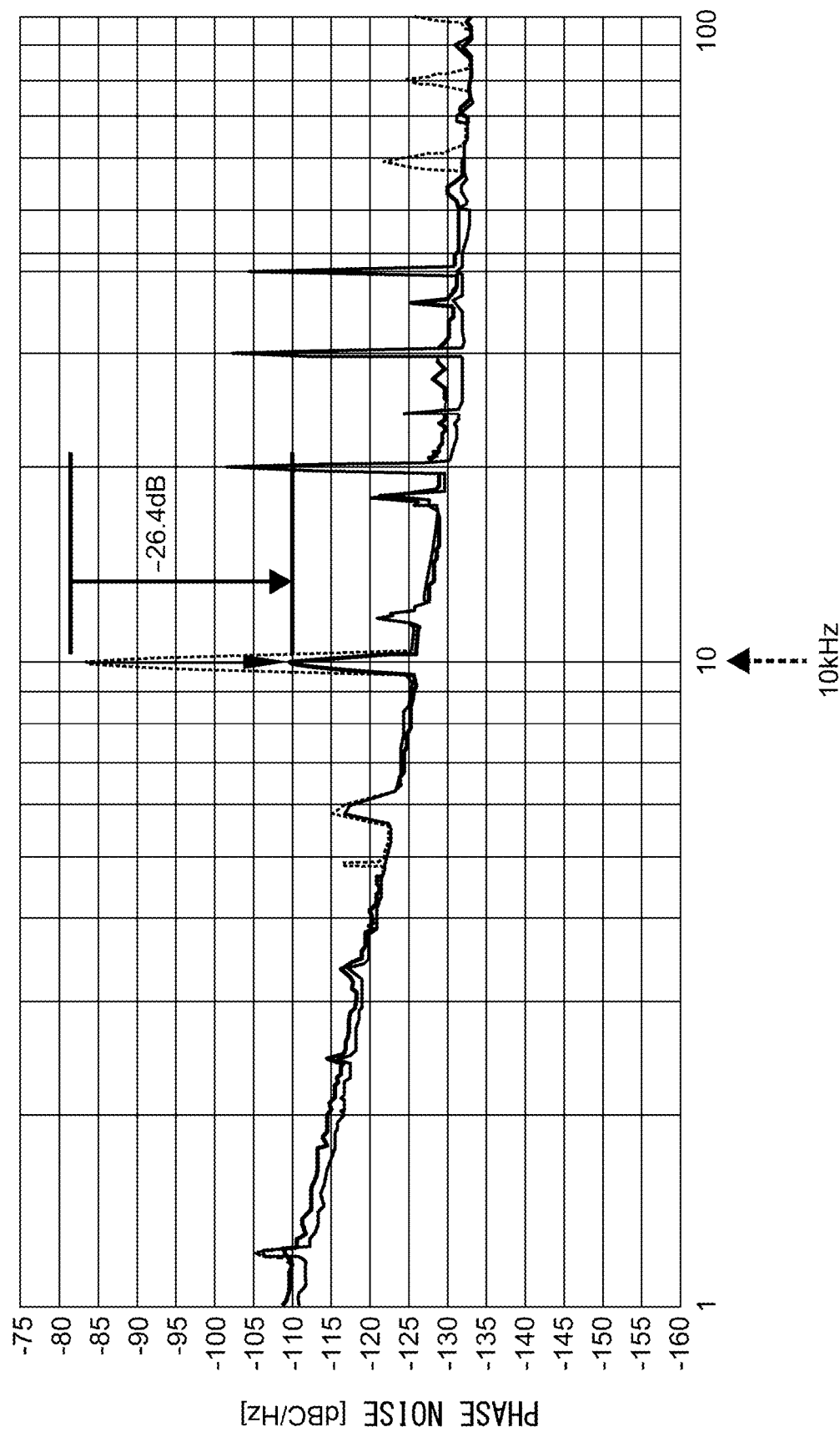
FIG. 13 is a diagram showing results of measurement of the phase noise characteristics.

FIG. 13 is a diagram showing the measurement results of the phase noise characteristics. The solid line indicates the characteristics in a case in which power supply noise having a frequency of 10 kHz and an amplitude of 0.1 V is superimposed on the power supply voltage $V_{DD}$. FIG. 13 also shows the characteristics in a case in which the power supply circuit 100 is omitted. As can be understood based on such a comparison between them, in a case in which the power supply circuit 100 is provided, such an arrangement provides dramatically improved phase noise characteristics (26 dB).

Figure 14B:
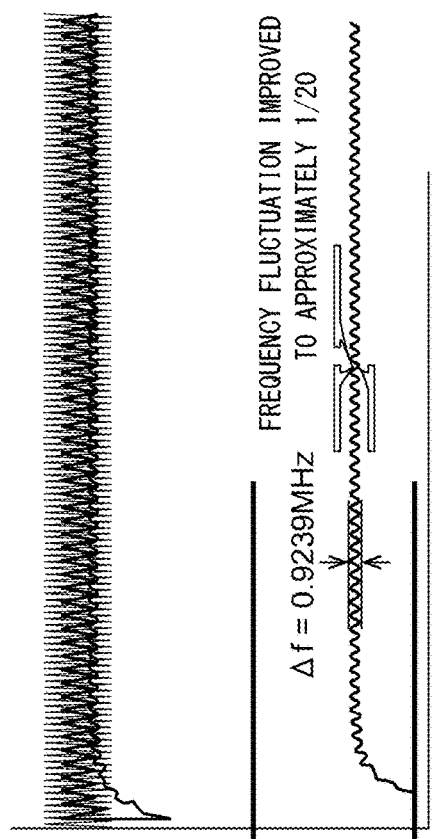
FIGS. 14A and FIG. 14B are diagrams each showing the time frequency waveforms (simulation results) of the power supply voltage $V_{DD}$, the output voltage $V_{OUT}$, and the frequency of a clock CLK.
Figure 14A:
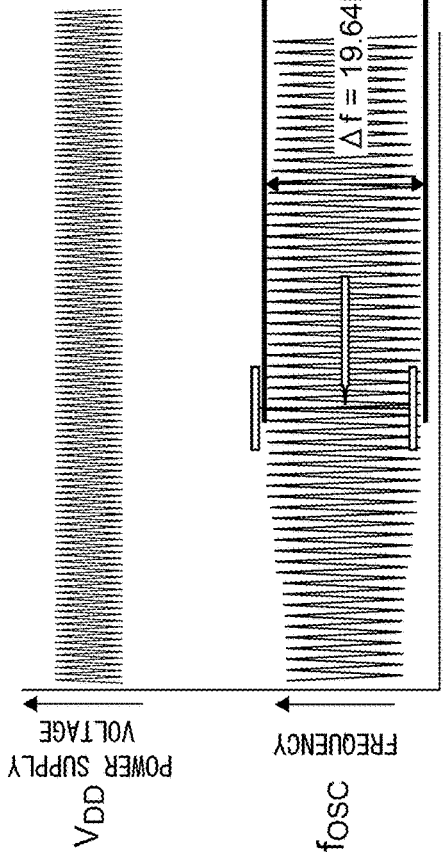

FIGS. 14A and FIG. 14B are diagrams each showing time frequency waveforms (simulation results) of the power supply voltage $V_{DD}$, the output voltage $V_{OUT}$, and the clock CLK. FIG. 14A shows the waveforms in a case in which the power supply circuit 100 is omitted. FIG. 14B shows the waveforms in a case in which the power supply circuit 100 is provided. Description will be made regarding an example in which the clock CLK has a frequency $f_{OSC}$ of 200 MHz, and the power supply noise has a frequency of 50 MHz.

Furthermore, in this example, the noise has an amplitude of 0.1 V, the power supply voltage $V_{DD}$ is set to 1.5 V, and the temperature is 25° C.

As can be understood based on a comparison between FIGS. 14A and FIG. 14B, in a case in which the power supply circuit 100 is provided, this arrangement allows the frequency fluctuation to be reduced to 1/20. The amount of fluctuation can be adjusted by adjusting the duty ratio of the switch control signal and the capacitance value employed in the power supply circuit 100.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

First Modification

The layout (topology) of the multiple switches included in the power supply circuit 100 is not restricted to such an arrangement shown in FIG. 4. Various kinds of other switch layouts may be employed so as to allow the input terminal 102, the multiple intermediate capacitors $C_1$ through $C_N$, and the output capacitor $C_{OUT}$ to be appropriately coupled and disconnected, which can be clearly understood by those skilled in this art.

Second Modification

Similarly, the configuration of the timing generator 120 is not restricted to such an arrangement shown in FIG. 5 or FIG. 7. Also, the operation sequence of the power supply circuit 100 is not restricted to such an arrangement shown in FIG. 6 or FIG. 8.

Third Modification

The load circuit of the power supply circuit 100 is not restricted to such a digital circuit. Also, the load circuit of the power supply circuit 100 may be configured as an analog circuit. That is to say, the circuit configuration of the load circuit of the power supply circuit 100 is not restricted in particular so long as it is configured as a circuit that consumes electric power in synchronization with a clock cycle.

Description has been made regarding the present invention with reference to the embodiments using specific terms. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A power supply circuit comprising:
an input terminal structured to receive a DC input voltage;
an output terminal to be coupled to a load;
a plurality of intermediate capacitors;
an output capacitor coupled to the output terminal; and
a control circuit structured to charge the plurality of intermediate capacitors using the input voltage in a time-sharing manner, to select at least one intermediate capacitor that is not being charged from among the plurality of intermediate capacitors, and to couple the intermediate capacitor thus selected to the output capacitor,
wherein the plurality of intermediate capacitors comprises first intermediate capacitors and second intermediate capacitors,
wherein the control circuit comprises:
 a first high-side switch arranged between the first intermediate capacitor and the input terminal;
 a second high-side switch arranged between the second intermediate capacitor and the input terminal;
 a first low-side switch arranged between the first intermediate capacitor and the output capacitor,
 a second low-side switch arranged between the second intermediate capacitor and the output capacitor; and
 a timing generator structured to control the first high-side switch, the second high-side switch, the first low-side switch, and the second low-side switch according to a clock,
wherein, during a first charging period with one edge of the clock as a start point, the timing generator turns on the first high-side switch and the second low-side switch,
and wherein, during a second charging period with the other edge of the clock as a start point, the timing generator turns on the second high-side switch and the first low-side switch.

2. A power supply circuit comprising:
an input terminal structured to receive a DC input voltage;
an output terminal to be coupled to a load;
a plurality of intermediate capacitors;
an output capacitor coupled to the output terminal; and
a control circuit structured to charge the plurality of intermediate capacitors using the input voltage in a time-sharing manner, to select at least one intermediate capacitor that is not being charged from among the plurality of intermediate capacitors, and to couple the intermediate capacitor thus selected to the output capacitor,
wherein the plurality of intermediate capacitors comprises first intermediate capacitors and second intermediate capacitors,
wherein the control circuit comprises:
 a first high-side switch arranged between the first intermediate capacitor and the input terminal;
 a second high-side switch arranged between the second intermediate capacitor and the input terminal,
 a first low-side switch arranged between the first intermediate capacitor and the output capacitor;
 a second low-side switch arranged between the second intermediate capacitor and the output capacitor, and
 a timing generator structured to control the first high-side switch, the second high-side switch, the first low-side switch, and the second low-side switch according to a clock,
wherein, during a first period with one edge of the clock as a start point, the timing generator turns on the first low-side switch,
wherein, during a second period with the other edge of the clock as a start point, the timing generator turns on the second low-side switch,
wherein, during a half-cycle of the clock delayed so as to include the first period, the timing generator turns on the second high-side switch, and wherein, during a half-cycle of the clock delayed so as to include the second period, the timing generator turns on the first high-side switch.

3. The power supply circuit according to claim 1, wherein the load comprises an oscillator structured to generate the clock,
wherein the timing generator comprises a delay line structured to delay the clock,
and wherein a delay amount provided by the delay line defines a length of an on time of the first low-side switch and the second low-side switch.

4. The power supply circuit according to claim 3, wherein the delay amount provided by the delay line is fixed.

5. The power supply circuit according to claim 3, wherein the delay line is structured as a replica of a delay circuit included in the oscillator.

6. The power supply circuit according to claim 5, wherein the delay line is structured to receive a supply of a control code that corresponds to a control code to be supplied to the delay circuit included in the oscillator.

7. The power supply circuit according to claim 3, wherein, in a case in which the power supply circuit is also operated as a low-pass filter, and the oscillator is operated with noise characteristics as a high-pass filter, a cutoff frequency of the low-pass filter is lower than a cutoff frequency of the high-pass filter.

8. An integrated circuit comprising:
a PLL circuit structured to generate a clock; and
a power supply circuit structured to supply a power supply voltage to the PLL circuit,
wherein the power supply circuit comprises:
an input terminal structured to receive a DC input voltage;
an output terminal coupled to a power supply line of the PLL circuit;
a first intermediate capacitor;
a second intermediate capacitor;
an output capacitor coupled to the output terminal;
a first high-side switch arranged between the first intermediate capacitor and the input terminal;
a second high-side switch arranged between the second intermediate capacitor and the input terminal;
a first low-side switch arranged between the first intermediate capacitor and the output terminal;
a second low-side switch arranged between the second intermediate capacitor and the output terminal; and
a timing generator structured to control the first high-side switch, the second high-side switch, the first low-side switch, and the second low-side switch, based on the clock;
wherein the PLL circuit comprises:
a first delay circuit structured to adjust a delay with a relatively low precision; and
a second delay circuit structured to adjust a delay with a relatively high precision,
wherein the integrated circuit comprises two of the power supply circuits,
wherein one from among the two power supply circuits supplies a power supply voltage to the first delay circuit,
and wherein the other from among the two power supply circuits supplies a power supply voltage to the second delay circuit.

9. The integrated circuit according to claim 8, wherein the timing generator is structured to be switchable between (i) a first charging state in which the first high-side switch is turned on and the second high-side switch is turned off, (ii) a second charging state in which the first high-side switch is turned off and the second high-side switch is turned on, and (iii) a non-charging state in which both the first high-side switch and the second high-side switch are turned off, and to sequentially repeat the first charging state, the non-charging state, the second charging state, and the non-charging state.

10. The integrated circuit according to claim 9, wherein, in the first charging state, the timing generator couples the second intermediate capacitor to the output capacitor,
and wherein, in the second charging state, the timing generator couples the first intermediate capacitor to the output capacitor.

11. The integrated circuit according to claim 8, wherein the timing generator is structured to sequentially and alternately repeat (i) a first charging state in which the first high-side switch is turned on and the second high-side switch is turned off, and (ii) a second charging state in which the first high-side switch is turned off and the second high-side switch is turned on.

12. The integrated circuit according to claim 11, wherein, in a part of a time period of the first charging state, the timing generator turns on the second low-side switch,
and wherein, in a part of a time period of the second charging state, the timing generator turns on the first low-side switch.

13. The power supply circuit according to claim 2, wherein the load comprises an oscillator structured to generate the clock,
wherein the timing generator comprises a delay line structured to delay the clock,
and wherein a delay amount provided by the delay line defines a length of an on time of the first low-side switch and the second low-side switch.

14. The power supply circuit according to claim 13, wherein the delay amount provided by the delay line is fixed.

15. The power supply circuit according to claim 13, wherein the delay line is structured as a replica of a delay circuit included in the oscillator.

16. The power supply circuit according to claim 15, wherein the delay line is structured to receive a supply of a control code that corresponds to a control code to be supplied to the delay circuit included in the oscillator.

17. The power supply circuit according to claim 13, wherein, in a case in which the power supply circuit is also operated as a low-pass filter, and the oscillator is operated with noise characteristics as a high-pass filter, a cutoff frequency of the low-pass filter is lower than a cutoff frequency of the high-pass filter.

* * * * *